(12) United States Patent
Zhu

(10) Patent No.: US 8,209,161 B2
(45) Date of Patent: Jun. 26, 2012

(54) METHOD, SYSTEM, AND COMPUTER PROGRAM PRODUCT FOR LITHOGRAPHY SIMULATION IN ELECTRONIC DESIGN AUTOMATION

(75) Inventor: Zhenhai Zhu, Alameda, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 664 days.

(21) Appl. No.: 12/347,926

(22) Filed: Dec. 31, 2008

(65) Prior Publication Data

US 2010/0169060 A1   Jul. 1, 2010

(51) Int. Cl.
*G06F 17/50* (2006.01)
(52) U.S. Cl. ............................. 703/13; 716/51
(58) Field of Classification Search .................... 703/13; 716/50, 51
See application file for complete search history.

(56) References Cited

U.S. PATENT DOCUMENTS

| | | | |
|---|---|---|---|
| 6,349,272 | B1 | 2/2002 | Phillips |
| 7,590,518 | B2 | 9/2009 | Phillips |
| 2003/0115569 | A1* | 6/2003 | Ikeuchi ........................ 716/19 |
| 2005/0114823 | A1* | 5/2005 | Kuchler et al. ................ 716/21 |
| 2005/0185159 | A1* | 8/2005 | Rosenbluth et al. ............ 355/53 |

OTHER PUBLICATIONS

Chan, T.F. "Rank Revealing QR Factorizations" Iin. Alg. Appl., 1987, vols. 88/89, pp. 67-82, Elsevier Science Publishing Co., Inc., New York, NY.

Daniel, L. et al. "Geometrically parametrized interconnect performance models for interconnect synthesis" Proceedings of the 2002 International Symposium on Physical Design (ISPD '02), San Diego, CA Apr. 7-10, 2002. pp. 202-207.

Daniel. L. et al. "Automatic Generation of Geometrically Parameterized Reduced Order Models for Integrated Spiral RF-Inductors" Behavioral Modeling and Simulation (BMAS 2003), Monte Mar, CA. Oct. 7-8, 2003, pp. 1-6.

Daniel, L. et al. "A Multiparameter Moment-Matching Model-Reduction Approach for Generating Geometrically Parameterized Interconnect Performance Models" IEEE Transactions on Computer-Aided Design of Integrated Circuits and Systems, May 2004, vol. 23, No. 5, pp. 678-693.

Ellner, N. et al. "Alternating Direction Implicit Iteration for Systems with Complex Spectra" Siam Journal of Numerical Analysis, Jun. 1991, vol. 38, No. 3, pp. 859-870.

Feldmann. P. et al. "Efficient Linear Circuit Analysis by Pade Approximation via the Lanczos Process" IEEE Transactions on Computer-Aided Design of Integrated Circuits and Systems. May 1995, vol. 14. No. 5. pp. 639-649.

Glover. K. "All optimal Hankel-norm approximations of linear multivariable systems and their L(infinity)-error bounds" International Journal of Control, 1984. vol. 39, No. 6, pp. 1115-1193.

(Continued)

*Primary Examiner* — Paul Rodriguez
*Assistant Examiner* — Luke Osborne
(74) *Attorney, Agent, or Firm* — Vista IP Law Group, LLP

(57) ABSTRACT

Disclosed are improved methods, systems, and computer program products for lithographic simulation of an electronic circuit design. Various embodiments of the present invention identifies a mask pattern, performs offline precharacterization for the mask pattern by solving an equation which models a solution for the mask pattern and an interaction between the mask pattern and one or more effects, performs online evaluation based at least upon a parameterized form of the equation, determines a field around the mask pattern based at least upon the act of performing the online evaluation, and stores a result of the act of determining an electromagnetic field around the mask pattern in a tangible computer readable or usable medium

20 Claims, 9 Drawing Sheets

OTHER PUBLICATIONS

Grimme, E. "Krylov Projection Methods for Model Reduction" PhD thesis, Coordinated-Science Laboratory, University of Illinois at Urbana-Champaign, Urbana-Champaign, IL, 1997.

Gunupudi, P.K. et al. "Nonlinear Circuit-Reduction of High-Speed Interconnect Networks Using Congruent Transformation Techniques" IEEE Transactions on Advanced Packaging, Aug. 2001, vol. 24, No. 3, pp. 317-325.

Heydari, P. et al. "Model Reduction of Variable-Geometry Interconnects using Variational Spectrally-Weighted Balanced Truncation" Proceedings of the 2001 IEEE/ACM International Conference on Computer-Aided Design ICCAD 2001 ). San Jose, CA, Nov. 4-8, 2001, pp. 586-591.

Lu, A. et al. "Solution of Lyapunov Equations by Alternating Direction Implicit Iteration" Computers Math. Applic., 1991, vol. 21 No. 9, pp. 43-58.

Moore, B. "Principal Component Analysis in Linear Systems: Controllability, Observability, and Model Reduction" IEEE Transactions on Automatic Control. Feb. 1981, vol. 26, No. 1, pp. 17-32.

Obadasioglu, A. et al. "PRIMA: Passive Reduced-Order Interconnect Macromodeling Algorithm" IEEE Transactions on Computer-Aided Design of Integrated Circuits and Systems, Aug. 1998, vol. 17, No. 8, pp. 645-654.

Phillips, J. R. "Projection-Based Approaches for Model Reduction of Weakly Nonlinear, Time-Varying Systems" IEEE Transactions on Computer-Aided Design of Integrated Circuits and Systems, Feb. 2003, vol. 22. No. 2, pp. 171-187.

Phillips, J. R. "A statistical perspective on nonlinear model reduction" Proceedings of the 2003 International Workshop on Behavioral Modeling and Simulation (BMAS 2003) Oct. 7-8, 2003, pp. 41-46.

Phillips. J. R. et al. "Analog Macromodeling using Kernel Methods" Proceedings of the IEEEIACM International Conference on Computer-Aided Design (ICCAD—2003). Santa Clara, CA. Nov. 9-13, 2003, pp. 446-453.

Phillips, J. R. et al. "Poor Man's TBR: A Simple Model Reduction Scheme" Proceedings of the Design, Automation and Test in Europe Conference and Exhibition. (Date '04). Paris, France. Feb. 16-20, 2004, vol. 2, pp. 938-943.

Phillips, J.R. "Variational Interconnect Analysis via PMTBR" Proceedings of the IEEEIACM International Conference on Computer-Aided Design (ICCAD—2004). Nov. 7-11, 2004. pp. 872-879.

Roychowdhury. J. "Reduced-Order Modeling of Time-Varying Systems" IEEE Transactions on Circuits and Systems II: Analog and Digital Signal Processing, Oct. 1999, vol. 46, No. 10, pp. 1273-1288.

Safonov, M. G. et al. "A Schur Method for Balanced Truncation Model Reduction" IEEE Transactions on Automatic Control, Jul. 1989, vol. 34, No. 7, pp. 729-733.

Starke, G. "Optimal Alternating Direction Implicit Parameters for Non symmetrical Systems of Linear Equations" Siam Journal of Numerical Analysis, Oct. 1991, vol. 28, No. 5, pp. 1431-1445.

Papoulis, A. Probability, Random Variables, and Stochastic Processes, 1991, Title Page, Table of Contents, Chapters 1-10, McGraw Hill, New York, NY.

Nuno Marques et al., Improving the Efficiency of Parasitic Extraction and Simulation of 3D Interconnect Models, Sep. 1999. ICECS'99—IEEE International Conference on Electronics, Circuits and Systems, Cyprus, pp. 1729-1732.

Jing-Rebecca Li and Frank Wang and Jacob K. White, An Efficient Lyapunov Equation-Based Approach for Generating Reduced-Order Models of Interconnect, 1999 Design Automation Conference, pp. 1-6.

Ying Liu et al., Model order-reduction of RC(L) interconnect including variational analysis, Design Automation Conference, Jun. 21, 1999-Jun. 25, 1999, pp. 201-206.

Misra et al., Structural invariants of generalized state space systems, American Control Conference, Jun. 29-Jul. 1, 1994, vol. 3, ISBN: 0-7803-1783-1, pp. 3548-3552.

Stewart, An updating algorithm for subspace tracking, Jun. 1992, IEEE Transactions on Signal Processing, vol. 40, Issue: 6, pp. 1535-1541.

Markovsky et al., Stability of reduced order models in subspace identification, May 8, 2003, IAP Study Day, Louvain-la-Neuve, Auditorium SC03, Place des Sciences, p. 1.

Tirapu-Azpiroz et al., "Boundary layer model to account for thick mask effects in photolithography," Optical Microlithography, Proceedings of the SPIE, Feb. 2003, pp. 1611-1619.

Adams et al., "Domain decomposition methods for the rapid electromagnetic simulation of photomask scattering," Journal of Microlithography, Microfabrication and Mirosystems, Oct. 2002, vol. 14, pp. 253-269.

Philips, "Variational interconnect analysis via PMTBR," International Conference on Computer Aided-Design, San Jose, CA, Nov. 2004, pp. 872-879.

Non-Final Office Action dated Nov. 21, 2006 for U.S. Appl. No. 10/932,406.

Final Office Action dated Jul. 16, 2007 for U.S. Appl. No. 10/932,406.

Advisory Action dated Oct. 16, 2007 for U.S. Appl. No. 10/932,406.

Non-Final Office Action dated Mar. 18, 2008 for U.S. Appl. No. 10/932,406.

Final Office Action dated Oct. 1, 2008 for U.S. Appl. No. 10/932,406.

Notice of Allowance dated May 6, 2009 for U.S. Appl. No. 10/932,406.

Stroud, Ah. "Approximate Calculation of Multiple Integrals", 1971, Title Page, Table of Contents. pp. 1-227, Prentice-Hall, Englewood Cliffs, NJ.

Stroud, Ah. "Approximate Calculation of Multiple Integrals", 1971, Title Page, Table of Contents. pp. 228-431, Prentice-Hall, Englewood Cliffs, NJ.

\* cited by examiner

METHOD, SYSTEM, AND COMPUTER PROGRAM PRODUCT FOR LITHOGRAPHY SIMULATION IN ELECTRONIC DESIGN AUTOMATION

CROSS-REFERENCE TO RELATED APPLICATION(S)

Certain aspects in some embodiments of this Application are related to and disclosed in U.S. application Ser. No. 10/932,406, now U.S. Pat. No. 7,590,518, which is entitled "CIRCUIT ANALYSIS UTILIZING RANK REVEALING FACTORIZATION" and was filed on Sep. 2, 2004, the content of which is incorporated by reference in their entirety in this Application.

BACKGROUND AND SUMMARY

The invention relates to technology for designing and verifying an integrated circuit ("IC") design.

An IC has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information, for example, of circuit primitives such as transistors and diodes, their sizes and interconnections.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design. For example, when an integrated circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance on the electrical interconnect must be considered.

To test an integrated circuit layout, the integrated circuit designer 'extracts' parasitic resistance and parasitic capacitance from the integrated circuit layout using an extraction application program. Then, the integrated circuit designer analyzes and possibly simulates the integrated circuit using the extracted parasitic resistance and parasitic capacitance information. If the parasitic resistance or parasitic capacitance causes undesired operation of the integrated circuit, then the layout of the integrated circuit must be changed to correct the undesired operation. Furthermore, minimizing the amount of parasitic resistance and parasitic capacitance can optimize the performance of the integrated circuit by reducing power consumption or increasing the operating speed of the integrated circuit.

Lithography simulation has recently gathered more attention in the past decades or two because of the increasing cost in manufacturing photomasks and development time to redesign and remanufacture a revised set of photomasks in case of an error in the design of the masks. A typical lithography system configuration is shown in FIG. 1 which comprises a light source 102, a lens 104, a photolithographic mask 106, a reduction lens 108, and the photo resist 110 on a wafer 112. There are three main steps in lithography simulation: optical simulation, photo mask modeling, and photo resist simulation. One of the main steps in lithography simulation is to simulate the propagation of light waves through a photo mask. The most accurate and robust approach to lithography simulation is to solve the Maxwell's equations using numerical techniques such as finite-difference time-domain (FDTD) or finite element method (FEM).

With the advance of deep submicron technologies, resolution enhancement techniques (RET) have become one of the most important techniques to guarantee design for manufacturability (DFM). Nonetheless, RET may pose further challenges to the integrated circuit (IC) design due to the continual pursuit for smaller geometry size and the use of shorter wavelength on the lithographic tools such as the 193 nm λ ultra-high numerical aperture (NA) lithography or even the Extreme Ultra Violet lithography, especially in the deep submicron and increasing clock frequency designs. For example, in order to meet the increasing demand for higher resolution and finer geometries, the semiconductor industry has been pushing in order to obtain larger numerical aperture (NA) to achieve smaller minimum feature size. However, larger numerical aperture also decreases the depth of focus, and such decreased depth of focus causes the lithographic tools' ability to print accurate circuits to be more sensitive to the topographical variation of the films on the wafer. This continual push towards smaller feature sizes and higher clock frequencies has made lithographic simulation even more important.

Experience indicates that even the state-of-the-art solvers are too slow or memory-bounded to handle a medium-size mask structure. As a result, a compact mask model is commonly used to obtain an approximate solution. A commonly used compact model is based on the Kirchhoff approximation or a thin mask model—if there is a mask opening, the light shines through it without any change in magnitude and phase; otherwise, the light is taken as completely blocked in the Kirchhoff model. This Kirchhoff approximation, however, neglects the effects such as diffraction, polarization, and coupling among various openings and features in the mask. On the other hand, the accuracy of the Kirchhoff approximation is reasonably good if two assumptions are satisfied. Firstly, the Kirchhoff approximation assumes that the thickness of the mask is sufficiently smaller than the wavelength of the incidence wave. The Kirchhoff approximation further assumes that the size of the openings is sufficiently larger than the wavelength of the incidence wave. Nonetheless, this is clearly not the case for phase-shifted masks. Moreover, these assumptions may no longer be true even for the binary mask for 45 nm or smaller technology nodes. It has been demonstrated that the Kirchhoff approximation, or the thin mask model, fails when the thickness of the mask is greater than the wavelength of the incidence wave of the lithographic equipment. It has also been demonstrated that the Kirchhoff approximation or the thin mask model fails to provide satisfactory solution when the size of the aperture is smaller than the wavelength of the incidence wave of the lithographic equipment.

Several attempts have been made to obtain a modified mask model or a modified Kirchhoff model to improve the accuracy. These attempts seek to tune the width of the aperture and/or the transmission coefficients to fit the far field generated by a more accurate solver. There are two commonly used approaches to generate such a modified mask model or modified Kirchhoff model. The first approach generally uses the boundary layer method which requires a 3D solver as the core engine and is thus CPU (central processing unit) intensive. The other commonly used approach uses the domain decomposition method which generally uses a 2D solver as the core engine but ignores the coupling between openings and features due to the domain decomposition and any mixing of different polarization components. Both methods produce the so-called modified thin-mask model. The key parameters in these models, the sizes and the transmission coefficients of the openings, are basically tuned to fit the far-field predicted by the modified thin-mask model to that predicted by the full field solver.

Nonetheless, most, if not all, of the approaches suffer from some major drawbacks. These modified thin-mask approaches are based directly or indirectly upon a heuristic parametric model which is derived from physical assumptions. The quality of the model then depends on the apriori assumptions. For example, an artificial rectangular aperture or an opening with a constant transmission coefficient across the aperture or opening is used to mimic the diffraction pattern on the wafer surface. Mathematically and practically, this is a multi-dimensional curve fitting process for some intrinsic parameters which include, for example, width and height of the rectangular aperture or opening, the constant transmission coefficient, the profile of the phase-shift mask, and a host of illumination parameters (e.g., on-axis or off-axis, shape and size of the source, etc.) The accuracy of such a curve-fitting process has been demonstrated to be unreliable. Moreover, in order to make this multi-dimensional curve fitting process tractable, most, if not all, of these modified thin-mask approaches considers only one aperture or opening at a time and do not account for coupling among various openings and features in the mask.

In addition, these multi- or high-dimensional piecewise constant curve fitting functions may be relatively simpler and efficient, but they may not be sufficiently accurate to meet the design requirements. For example, it is hard to account for effects such as diffraction, coupling, or polarization with these modified thin-mask models. One could use more sophisticated curve fitting techniques to improve the accuracy, but the high-dimensional curve fitting is typically not sufficiently robust or efficient. Hence these modified thin-mask models are typically limited only to small number of parameters in small mask structures.

That is, these modified thin-mask models are essentially a result of a multi-dimensional curve fitting process which is known to be numerically unreliable and CPU intensive. It is also very difficult to assert the accuracy of such modified thin-mask models, and hence the fidelity of the models is not guaranteed. More importantly, a few critical assumptions are made to simplify the form of the modified thin-mask model in order to make the curve fitting process tractable. As a consequence, many important effects, such as couplings among openings and features and polarization, are not well modeled in the modified thin-masks model. For more advanced technology nodes, when the feature size is 45 nm or below, the poor accuracy of such modified thin-mask or modified Kirchhoff models would render these models much less useful than they are at 65 nm or above technology nodes.

For technology nodes up to 65 nm, the mask feature sizes are almost always bigger than the wave length of lithography light sources of the photo lithographic equipment. The mask models in the Kirchhoff models may represent a reasonable compromise between accuracy and simulation speed. Nonetheless, starting from 45 nm technology nodes, the mask feature sizes become increasingly smaller than the wave length(s) of the lithographic equipment, and this continual shrinkage of the feature sizes has rendered the accuracy of the Kirchhoff mask models even more questionable.

Therefore, it is desirable to devise a method, system, and computer program product to better simulate the photolithography process with better accuracy and efficiency. More particularly, some embodiments achieve better accuracy by accommodating some or all relevant effects without having to solve the physics-based partial differential equations. Some embodiments maintains better efficiency by starting with a physics-based governing equation incorporating relevant effects while employing model reduction techniques to improve the efficiency.

DESCRIPTION OF FIGURES

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

The invention is described with reference to specific embodiments. It will, however, be evident that various modifications and changes may be made thereto without departing from the broader spirit and scope of the invention. The reader is to understand that the specific ordering and combination of process actions shown in the process flow diagrams and system components in component diagrams described herein are merely illustrative, and the invention can be performed using different, additional, or different combinations/ordering of process actions and components. The specification and drawings are, accordingly, to be regarded in an illustrative rather than restrictive sense.

Various embodiments of the invention which are directed to an improved method, system, and computer program product for implementing a process for lithographic simulation. The process comprises an act of offline pre-characterization which comprises generating a library or a library of model(s) for one or more representative photolithographic mask patterns with desirable and/or configurable accuracy and/or flexibility to account for various lithographic effects such as, but not limited to, diffraction, polarization, and/or coupling among various openings and features in the photolithographic mask. The process further comprises an act of online evaluation of the layout for the electronic circuit design of interest. The act of online evaluation comprises recognizing one or more known photolithographic mask patterns in a layout and evaluating the corresponding model. Other and additional objects, features, and advantages of the invention are described in the detailed description, figures, and claims.

Figure 2:
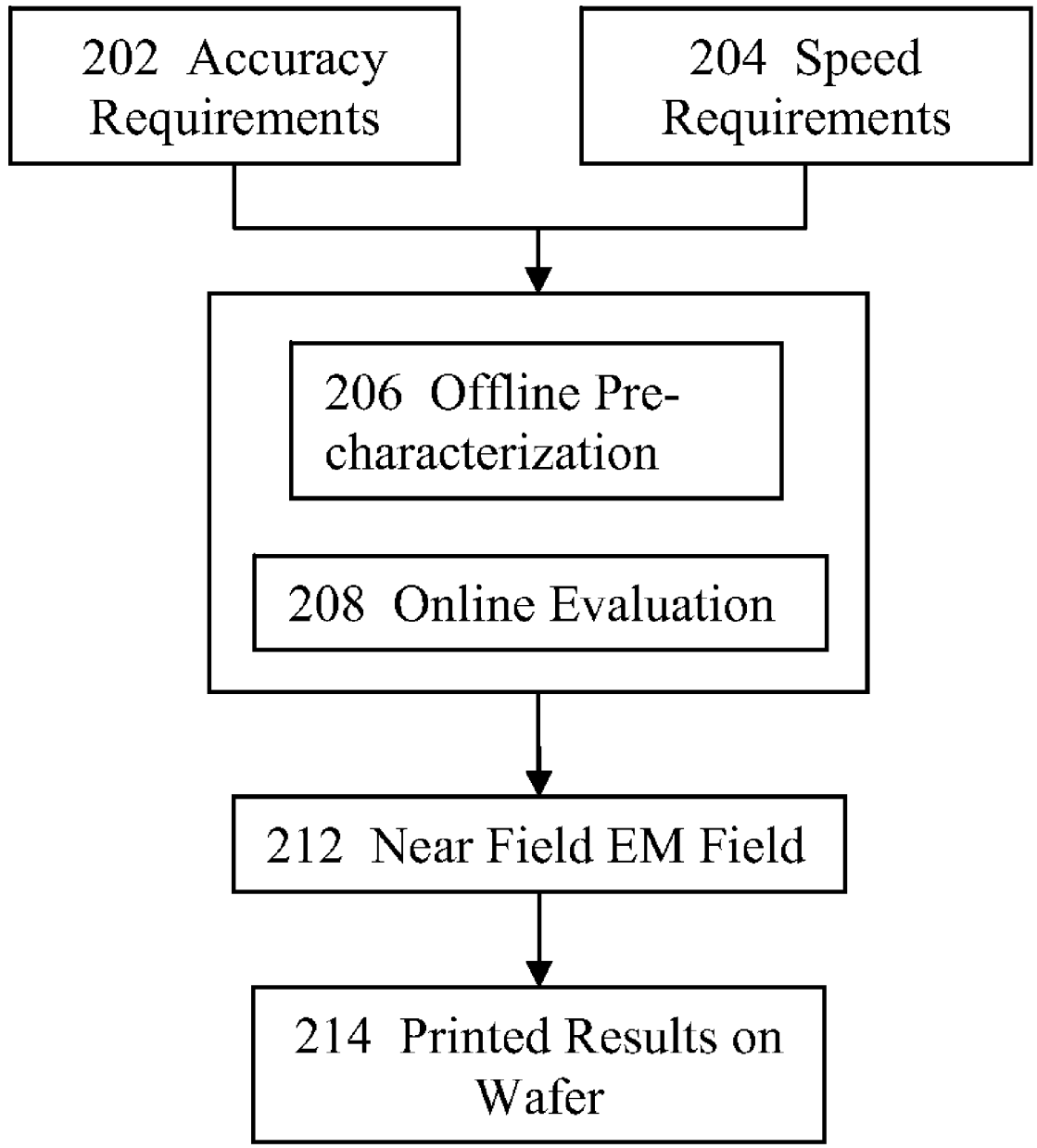
FIG. 2 illustrates a high level diagram of a system or a process for implementing lithographic simulation for an electronic circuit design in several embodiments of the invention.

FIG. 2 depicts a high level diagram of a system or a process for implementing lithographic simulation for an electronic circuit design in several embodiments of the invention. At 202, the system or the process for implementing lithographic simulation for an electronic circuit design respectively identifies accuracy requirements in some embodiments of the invention. At 204, the system or the process for implementing lithographic simulation for an electronic circuit design respectively identifies speed requirements in some embodiments of the invention. At 206, the system or the process for implementing lithographic simulation for an electronic circuit design performs the offline pre-characterization in some embodiments of the invention. At 208, the system or the process for implementing lithographic simulation for an electronic circuit design performs the online evaluation in some embodiments of the invention. At 210, the system or the process for implementing lithographic simulation for an electronic circuit design performs the optional model reduction to reduce the model size so as to improve efficiency in some embodiments of the invention. At 212, the system or the process for implementing lithographic simulation for an electronic circuit design determines the near field electromagnetic (EM) field in some embodiments of the invention. At 214, the system or the process for implementing lithographic simulation for an electronic circuit design predicts or estimates the printed results on wafers based on the offline pre-characterization at 206 and online evaluation at 208 in some embodiments of the invention.

Note that the system or the process for implementing lithographic simulation for an electronic circuit design as illustrated in FIG. 2 does not necessarily require both the accuracy and the speed requirements to achieve the intended purpose. In some embodiments, the system or the process for implementing lithographic simulation for an electronic circuit design executes and achieves the intended purpose with even no input for the accuracy and the speed requirements. Moreover, the accuracy and speed requirements may be specified by a designer in various ways. For example, a designer may explicitly specify the requirement for three-decimal place accuracy. The accuracy or the speed requirement may also be automatically determined by the system implementing the process based upon some or even no input from designers. More details of each of the actions in FIG. 2 will be explained in more details in the following sections.

Figure 4:
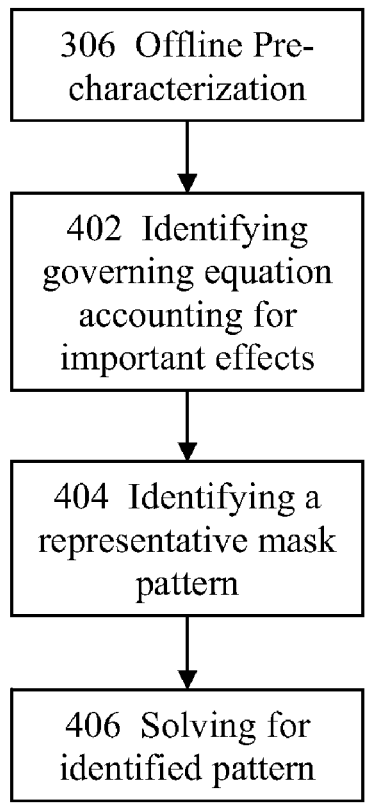
FIG. 4 illustrates more details about the offline pre-characterization module in the system or the process for implementing lithographic simulation for an electronic circuit design.

FIG. 4 illustrates more details about the offline pre-characterization module 206 in the system or the process for implementing lithographic simulation for an electronic circuit design. At 402, the system or the process for implementing lithographic simulation for an electronic circuit design identifies one or more governing equations for the lithographic simulation in some embodiments of the invention. In some embodiments, the system or the process for implementing lithographic simulation for an electronic circuit design formulates the mask modeling for lithographic simulation as a parameterized Helmholtz equation where the parameters comprise the mask feature sizes such as, but not limited to, the width of a feature in the mask and the spacing between certain features in the mask.

Figure 1:
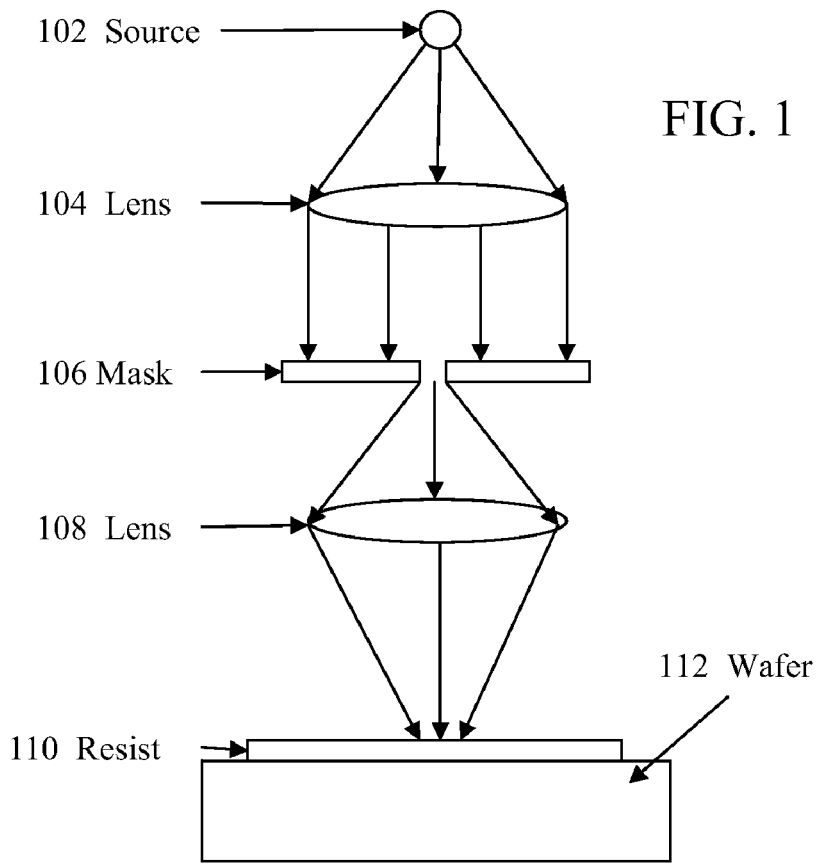
FIG. 1 illustrates a typical lithographic system configuration.
Figure 3:
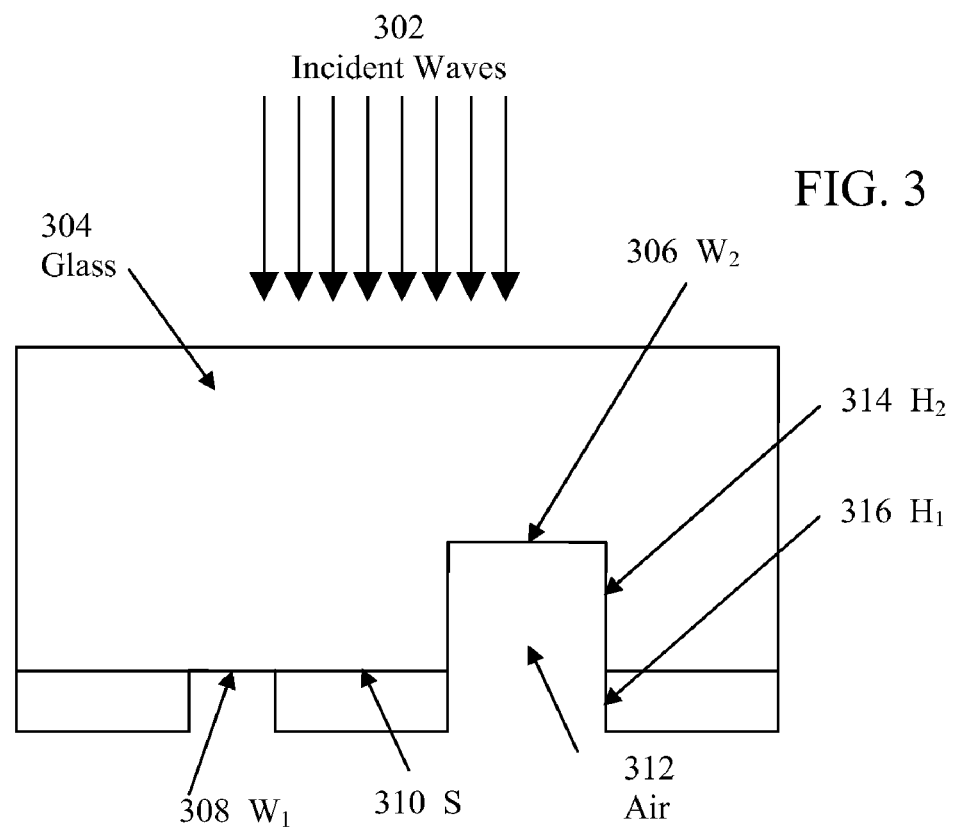
FIG. 3 illustrates a simplified two-dimensional phase-shift mask for the sole purpose of explaining the act of identifying one or more governing equations for the lithographic simulation.

FIG. 3 illustrates a simplified two-dimensional phase-shift mask for the sole purpose of explaining the act of identifying one or more governing equations for the lithographic simulation at 402. The extension to three-dimensional cases is straightforward in light of the disclosure below and will not be repeated here. Note that in FIG. 3, the incident light waves 302 shine through the glass 304, and $W_1$ (308), $W_2$ (306), S (310), $H_1$ (314), and $H_2$ (316) represent parameters in the reduced mask model. Note that 312 may represent air or vacuum. Assuming an S-polarization (TE) case for the sole purpose of explanation, the governing Helmholtz equation may be written as:

$$\nabla^2 u - w^2 \epsilon \mu u = 0 \quad (1)$$

Where u(x,y) is the y-component of the total electric field. In some embodiments where the FEM (finite element method) is employed, the following variational form may be obtained:

$$\int_\Omega ds \nabla v \cdot \nabla u - w^2 \int_\Omega ds \epsilon \mu v u - \int_{\partial\Omega} dl v DtN(u) = -2\int_{\partial\Omega} dl v DtN(u_{in}) \quad (2)$$

Where $\Omega$ and $\partial\Omega$ represents the computational domain and its boundary, $u_{in}$ represents the known incident wave, and the DtN( ) constitutes an operator which defines the transparent boundary condition(s). For the sole purpose of explanation, periodic boundary conditions are imposed along the east and west side of the computation domain $\Omega$, and transparent or non-reflecting boundary conditions are imposed along the north and the south side of the computational domain In some embodiments where the standard FEM piecewise linear basis functions are used to discretize the variational form as shown in Eq. (2), the parameterized system equation may be expressed as the following:

$$|S(\bar{w},\bar{s}) - M(\bar{w},\bar{s}) - B|\bar{u} = \bar{r} \quad (3)$$

Where $\bar{w}$ and $\bar{s}$ respectively denote the width and spacing in the layout; B denotes the boundary term, $\bar{u}$ denotes the y component of the electric field, $S(\bar{w},\bar{s})$ denotes the stiffness matrix, $M(\bar{w},\bar{s})$ denotes the mass matrix, and $\bar{r}$ denotes the right-hand-side term. It should be noted that there is a one-to-one correspondence between terms in Eqs. (2) and (3). In addition, in some embodiments with the unstructured mesh, the discretization on boundary $\partial\Omega$ can be made independent of $\bar{w}$ and $\bar{s}$, the width and spacing in the layout. In these embodiments, the boundary term B and the right-hand-side vector r are not function of $\bar{w}$ and $\bar{s}$. Moreover, it should be noted that r is a function of the incidence angle since it is related to the incidence wave, as shown in Eq. (2). Furthermore, it should be noted that the incidence angle is assumed to be constant for the sole purpose of ease of explanation and does not intend to limit the scope of the embodiments of the invention as such. Some embodiments follow the same procedures to derive a FEM discretization for a vectorized Helmholtz equation, and the details will not be repeated here. Some embodiments use the edge elements to account for continuity condition on element interfaces and arrive at a system matrix similar to that as shown in Eq. (3). The use of edge element to account for continuity condition on element interfaces is known to one of ordinary skill in the art and will not be repeated here.

The following paragraphs describe more details about the mathematical and theoretical foundation for the offline pre-characterization module and the online evaluation module in various embodiments of the invention. Various embodiments of the invention employ a model order reduction technique to reduce the order of the model. The model reduction module comprises the offline pre-characterization module 206 and the online evaluation module 208. For the ease of explanation, a parameterized governing equation is assumed to be the following:

$$A(\bar{\sigma})\bar{u} = (A_0 + \Sigma_i \sigma_i A_i)\bar{u} = \bar{r} \quad (4)$$

Where the size of vectors $\bar{u}$, $\bar{r}$ and matrix A is N×1, N×1, and N×N, respectively. In a practical application, N may be several millions or even larger numbers. In some embodiments, the offline pre-characterization module comprises randomly generating a set $\bar{\sigma}^k = \{\bar{\sigma}_1^k, \bar{\sigma}_2^k, \ldots\}$ using the given ranges of $\sigma_i$ and solve Eq. (4) for $\bar{u}_k$. After a few sampling solves in some embodiments, the offline pre-characterization module further comprises storing all solutions in to the projection matrix P as shown below.

$$P = |\bar{u}_1, \bar{u}_2, \ldots, \bar{u}_N| \quad (5)$$

And the offline pre-characterization module further comprises performing projection $$\hat{A}_i = P^T A_i P; \hat{r} = P^T \bar{r} \quad (6)$$

The reduced governing equation may then be expressed as follows as shown in Eq. (6) in some embodiments of the invention.

$$\left(\hat{A}_o + \sum_i \sigma_i \hat{A}_i\right) \hat{u} = \hat{r} \quad (7)$$

The size of matrix $\hat{A}_i$ is M×M and M is the number of sampling solves. Note that in some embodiments, the columns in the projection matrix P are orthogonalized using techniques such as incremental QR decomposition or SVD (Singular Value Decomposition). This makes the projection matrix P a well conditioned matrix in these embodiments of the invention.

The model reduction module further comprises the online evaluation module 208. In some embodiments where the given set $\sigma^*$ is substituted into Eq. (7), solving for $\hat{u}$ gives the approximate solution to Eq. (4) as follows.

$$u = P\hat{u} \quad (7)$$

In these embodiments, the CPU time the online evaluation module takes is only related to M, not to N in Eq. (4). M is typically many orders of magnitude smaller than N. Therefore, Eq. (7) is a more efficient but still accurate reduced model than the original model as shown in Eq. (4). Note that the efficiency gain depends on whether matrix Ai in Eq. (4) is not a function of $\sigma_i$. If Ai in Eq. (4) is a function of $\sigma_i$ the projection as shown in Eq. (6) involves calculating $Ai(\sigma_i)$ at a particular value of $\sigma_i$. This may mean that the CPU time used by the reduced model as shown in Eq. (7) is related to the original problem size N.

Referring back to FIG. 3, the system or the process for implementing lithographic simulation for an electronic circuit design identifies a representative mask pattern at 404 in some embodiments of the invention. Note that in some embodiments, the representative mask pattern identified may be from the mask layout of the electronic circuit design of interest, and in some other embodiments, the representative mask pattern may be identified from a library of mask patterns stored in a persistent or non-persistent data storage device such as a memory or a hard drive. In some embodiments where the system or the process for implementing lithographic simulation for an electronic circuit design identifies the representative mask pattern from a library stored in a persistent or non-persistent storage device, the system or the method may further determine the identified mask pattern is representative or whether further calibration or adjustment for the identified mask pattern shall be performed. At 406, the system or the process for implementing lithographic simulation for an electronic circuit design solves for the identified representative mask pattern.

Figure 5:
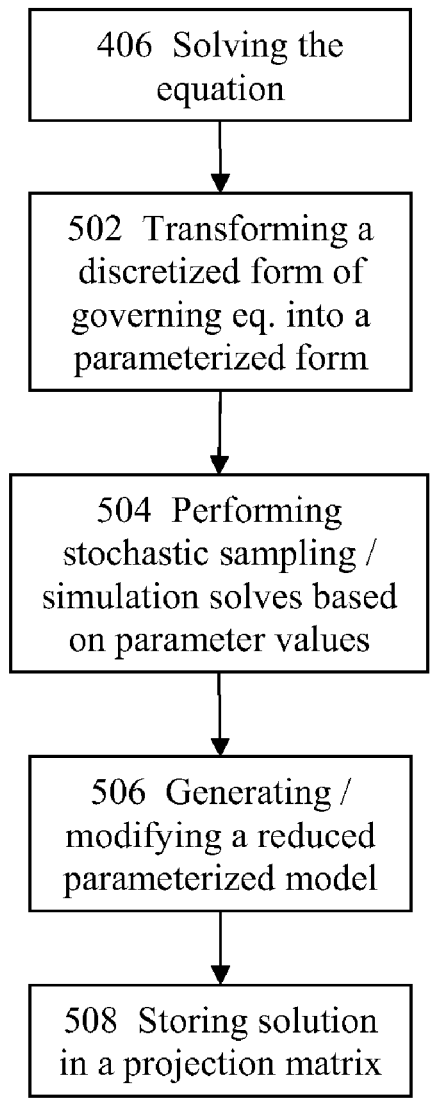
FIG. 5 illustrates more details about the action of solving for the identified mask pattern.
Figure 5A:
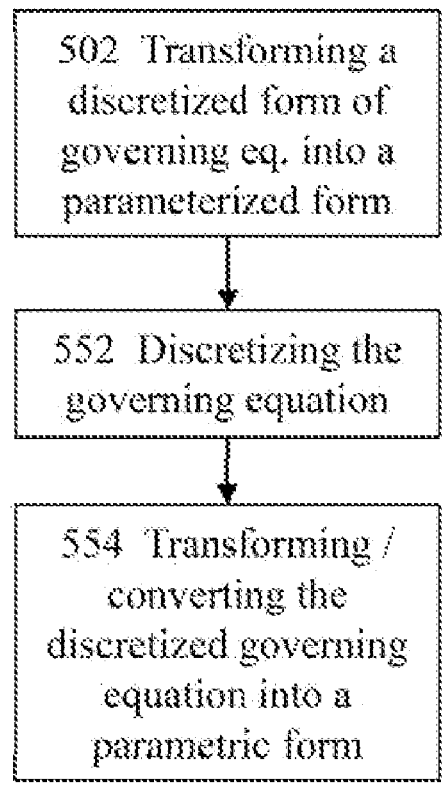
FIG. 5A illustrates more details about the action of transforming a discretized form of one or more governing equation into a parameterized form.

Referring to FIG. 5 which illustrates more details about the action of solving for the identified mask pattern at 406. In some embodiments, the system or the process for implementing lithographic simulation for an electronic circuit design discretizes the one or more governing equations and transforms or converts the one or more discretized governing equations into parametric form(s) at 502. More specifically, the system or the process for implementing lithographic simulation for an electronic circuit design discretizes the governing equation at 552 and transforms or converts the discretized governing equation into a parametric form at 554.

The following sections which are entitled "One-Dimensional FEM Matrices" and "Two-Dimensional FEM Matrices" give some examples for how to parameterize the stiffness matrix and the mass matrix in an affine form by using uniform rectangular linear elements in some embodiments of the invention. It shall be noted that these sections are provided merely for explanation and illustration purposes and do not intend to limit the scope of the invention.

A. One-Dimensional FEM Matrices

The standard one-dimensional linear element may be defined as follows.

$$u^h(x) = a_0 + a_1 x = [1 \; x] \begin{bmatrix} a_0 \\ a_1 \end{bmatrix}, \tag{8}$$

In some embodiments where the system or the process for implementing lithographic simulation for an electronic circuit design matches the interpolation function with the nodal value, Eq. (4) is thus obtained as follows.

$$\begin{bmatrix} 1 & 0 \\ 1 & h \end{bmatrix} \begin{bmatrix} a_0 \\ a_1 \end{bmatrix} = \begin{bmatrix} u_0 \\ u_1 \end{bmatrix}, \tag{9}$$

where $u_0$ and $u_1$ denote the nodal values of $u(x)$ at $x=0$ and $h$ respectively. In some embodiments, the system or the process for implementing lithographic simulation for an electronic circuit design solves Eq. (9) and obtains $$\begin{bmatrix} a_0 \\ a_1 \end{bmatrix} = \frac{1}{h} \begin{bmatrix} h & 0 \\ -1 & 1 \end{bmatrix} \begin{bmatrix} u_0 \\ u_1 \end{bmatrix} = [H] \begin{bmatrix} u_0 \\ u_1 \end{bmatrix}, \tag{10}$$

In some embodiments, the system or the process for implementing lithographic simulation for an electronic circuit design substitutes Eq. (10) into Eq. (8) and obtains the following.

$$u^h(x) = [1 \; x][H] \begin{bmatrix} u_0 \\ u_1 \end{bmatrix} = \begin{bmatrix} \phi_0(x) \\ \phi_1(x) \end{bmatrix}^T \begin{bmatrix} u_0 \\ u_1 \end{bmatrix}, \tag{11}$$

$$\text{where } \bar{\phi}(x) = \begin{bmatrix} \bar{\phi}_0(x) \\ \bar{\phi}_1(x) \end{bmatrix} = [H]^T \begin{bmatrix} 1 \\ x \end{bmatrix} = \begin{bmatrix} 1 - \frac{x}{H} \\ \frac{x}{h} \end{bmatrix} \tag{12}$$

Eq. (12) defines the shape functions for the one-dimensional linear elements in some embodiments of the invention. In some embodiments which follow the standard FEM procedure, the system or the process for implementing lithographic simulation for an electronic circuit design obtains the mass matrix for each one-dimensional element as follows.

$$m_1(h) = \int_0^h dx \bar{\phi}(x)[\bar{\phi}(x)]^T \tag{13}$$

$$= [H]^T \int_0^h \begin{bmatrix} 1 \\ x \end{bmatrix} [1 \; x] dx [H]$$

$$= [H]^T \begin{bmatrix} h & \frac{h^2}{2} \\ \frac{h^2}{2} & \frac{h^3}{3} \end{bmatrix} [H]$$

$$= \frac{h}{6} \begin{bmatrix} 2 & 1 \\ 1 & 2 \end{bmatrix}$$

and the stiffness matrix for each one-dimensional linear element is defined as follows in some embodiments of the invention.

$$s_1(h) = \int_0^h dx \frac{d\bar{\phi}(x)}{dx} \left[ \frac{d\bar{\phi}(x)}{dx} \right]^T \tag{14}$$

$$= [H]^T \int_0^h \begin{bmatrix} 0 \\ 1 \end{bmatrix} [0 \; 1] dx [H]$$

$$= [H]^T \begin{bmatrix} 0 & 0 \\ 0 & h \end{bmatrix} [H]$$

$$= \frac{1}{h} \begin{bmatrix} 1 & -1 \\ -1 & 1 \end{bmatrix}$$

B. Two-Dimensional FEM Matrices

In some embodiments of the invention involving two-dimensional FEM matrices, each rectangular element has four vertices, and thus there are four shape functions associated with each linear element. In some embodiments, the system or the process for implementing lithographic simulation for an electronic circuit design uses the serendipity shape functions which constitute the Kronecker product of the one-dimensional functions along the x- and y-direction and may be expressed as follows.

$$\Psi(x, y) = \begin{bmatrix} \Psi_0(x, y) \\ \Psi_1(x, y) \\ \Psi_2(x, y) \\ \Psi_3(x, y) \end{bmatrix} = \begin{bmatrix} \phi_0(x)\phi_0(y) \\ \phi_0(x)\phi_1(y) \\ \phi_1(x)\phi_0(y) \\ \phi_1(x)\phi_1(y) \end{bmatrix} = \begin{bmatrix} \phi_0(x) \\ \phi_1(x) \end{bmatrix} \otimes \begin{bmatrix} \phi_0(y) \\ \phi_1(y) \end{bmatrix} \tag{15}$$

In view of Eq. (12), the system or the process for implementing lithographic simulation for an electronic circuit design obtains the following in some embodiments of the invention.

$$\Psi(x, y) = \left( H^T \begin{bmatrix} 1 \\ x \end{bmatrix} \right) \otimes \left( H^T \begin{bmatrix} 1 \\ y \end{bmatrix} \right) \tag{16}$$

In some embodiments where the system or the process for implementing lithographic simulation for an electronic circuit design uses the property of Kornecker product, the system or the process obtains the following.

$$\Psi(x, y)[\Psi(x, y)]^T = \left(H^T \begin{bmatrix} 1 \\ x \end{bmatrix} [1 \ x] H\right) \otimes \left(H^T \begin{bmatrix} 1 \\ y \end{bmatrix} [1 \ y] H\right) \quad (17)$$

$$\frac{\partial \Psi(x, y)}{\partial x} \left|\frac{\partial \Psi(x, y)}{\partial x}\right|^T = \left(H^T \begin{bmatrix} 0 \\ 1 \end{bmatrix} [0 \ 1] H\right) \otimes \left(H^T \begin{bmatrix} 1 \\ y \end{bmatrix} [1 \ y] H\right) \quad (18)$$

$$\frac{\partial \Psi(x, y)}{\partial y} \left|\frac{\partial \Psi(x, y)}{\partial y}\right|^T = \left(H^T \begin{bmatrix} 1 \\ x \end{bmatrix} [1 \ x] H\right) \otimes \left(H^T \begin{bmatrix} 0 \\ 1 \end{bmatrix} [0 \ 1] H\right) \quad (19)$$

In view of Eq. (17), the system or the process for implementing lithographic simulation for an electronic circuit design obtains the following mass matrix for each two-dimensional rectangular linear element in some embodiments of the invention.

$$m_2(h_x, h_y) = \int_0^{h_x} dx \int_0^{h_y} dy \Psi(x, y)[\Psi(x, y)]^T \quad (20)$$

$$= \left(H^T \int_0^{h_x} dx \begin{bmatrix} 1 \\ x \end{bmatrix} [1 \ x] H\right) \otimes$$

$$\left(H^T \int_0^{h_y} dy \begin{bmatrix} 1 \\ y \end{bmatrix} [1 \ y] H\right)$$

$$= \frac{h_x h_y}{36} \begin{bmatrix} 4 & 2 & 2 & 1 \\ 2 & 4 & 1 & 2 \\ 2 & 1 & 4 & 2 \\ 1 & 2 & 2 & 4 \end{bmatrix}$$

$$= h_x h_y m_2^e = \lambda_1 m_2^e$$

In view of Eqs. (18) and (19), the system or the process for implementing lithographic simulation for an electronic circuit design obtains the following stiffness matrix for each two-dimensional rectangular linear element in some embodiments of the invention.

$$s_2(h_x, h_y) = \int_0^{h_x} dx \int_0^{h_y} dy \left(\frac{\partial \Psi(x, y)}{\partial x} \left[\frac{\partial \Psi(x, y)}{\partial x}\right]^T + \right. \quad (21)$$

$$\left. \frac{\partial \Psi(x, y)}{\partial y} \left[\frac{\partial \Psi(x, y)}{\partial y}\right]^T\right)$$

$$= s_1(h_x) \otimes m_1(h_y) + m_1(h_x) \otimes s_1(h_y)$$

$$= \frac{h_y}{6h_x} \begin{bmatrix} 2 & 1 & -2 & -1 \\ 1 & 2 & -1 & -2 \\ -2 & -1 & 2 & 1 \\ -1 & -2 & 1 & 2 \end{bmatrix} +$$

$$\frac{h_x}{6h_y} \begin{bmatrix} 2 & -2 & 1 & -1 \\ -2 & 2 & -1 & 1 \\ 1 & -1 & 2 & -2 \\ -1 & 1 & -2 & 2 \end{bmatrix}$$

$$= \frac{h_y}{6h_x} s_{2a}^e + \frac{h_x}{6h_y} s_{2b}^e = \lambda_2 s_{2a}^e + \lambda_3 s_{2b}^e$$

In these embodiments, $m_2(h_x, h_y)$ and $s_2(h_x, h_y)$ are naturally in the affine form in which $\lambda_1$, $\lambda_2$, and $\lambda_3$ represent the abstract parameters. In some embodiments, the system or the process for implementing lithographic simulation for an electronic circuit design further establishes a connection or a relationship between these abstract parameters and the physical parameters such as those shown in FIG. 3. In some embodiments where uniform grid steps are used, the system or the process for implementing lithographic simulation for an electronic circuit design establishes the connection or relationship as a linear function. For example, in some embodiments where the optics (i.e., glass) is etched away by a thickness of $H_2$, the connection or the relationship between the abstract parameters and the physical parameters may be expressed as follows.

$$\frac{h_y}{h_x} = \frac{H_2}{W_2} h_x h_y = \alpha H_2 W_2 \quad (22)$$

where α is a constant related to the grid density in the region. In some embodiments where the system or the process for implementing lithographic simulation for an electronic circuit design uses, in view of Eq. (22), the standard stamping procedure to map local vertex indices to the global indices, the mass matrix and the stiffness matrix for this region may be expressed as follows.

$$M = M_i W_2 H_2 = M_i G_i \quad (23)$$

$$S = S_j^{(1)} \frac{H_2}{W_2} + S_k^{(2)} W_2 H_2 = S_j^{(1)} \sigma_j + S_k^{(2)} \sigma_k \quad (24)$$

The mass and the stiffness matrix for other region may also be constructed in the same or a substantially similar way and the final discrete system equation may be expressed as follows in some embodiments of the invention.

$$A(\bar{\sigma})\bar{u} = \left(\sum_j S_j^{(1)} \sigma_j + \sum_k S_k^{(2)} \sigma_k - \sum_i M_i \sigma_i - B\right) \bar{u} = \bar{r}_i \quad (25)$$

where matrix B corresponds to the transparent boundary term in Eq. (2), and vector $\bar{r}$ corresponds to the known incidence wave in Eq. (2) in some embodiments of the invention. In these embodiments, $S_j^{(1)}$, $S_k^{(2)}$, $M_i$, and B constitute constant matrices which are independent of parameters $\bar{\sigma}$. Moreover, the parameter $\bar{\sigma}$ constitutes a proxy to the physical parameter set ($W_1$, $W_2$, D, $H_1$, $H_2$) as shown in FIG. 3. In these embodiments, the system or the process for implementing lithographic simulation for an electronic circuit design may determine $\bar{\sigma}$ and then instantiate the corresponding $A(\bar{\sigma})$ in Eq. (25).

In some embodiments, the use of linear elements which are defined on a uniform rectangular mesh in analyzing a regular mask structures leads to a naturally affine parametric form for the stiffness matrix $S(\bar{w},\bar{s})$ and the mass matrix $M(\bar{w},\bar{s})$. In some other embodiments, unstructured mesh may be used to handle more complicated mask structures. The following paragraphs demonstrate an example of parameterizing unstructured triangular mesh in an affine form of the geometry parameters $\bar{w}$ and $\bar{s}$. In some embodiments of the invention, the stiffness matrix, $S(\bar{w},\bar{s})$, and the mass matrix, $M(\bar{w},\bar{s})$, are lower-order rational functions of spatial coordinates (x,y) of mesh nodes. That is, in these embodiments, the stiffness matrix and the mass matrix are also rational functions of the width $\bar{w}$ and the spacing $\bar{s}$. As a result, in these embodiments, the system or the process for implementing lithographic simulation for an electronic circuit design may perform first expand the stiffness matrix, $S(\bar{w},\bar{s})$, and the mass matrix, $M(\bar{w},\bar{s})$ by using techniques such as Taylor expansion, etc. to approximate $S(\bar{w},\bar{s})$ and $M(\bar{w},\bar{s})$ with affine forms.

In some embodiments where a geometric feature, such as 306 $W_2$ in FIG. 3, changes, the mesh points surrounding the geometric feature will move or change as well. Nonetheless, in order to capture the changes in the resulting electromagnetic field, not all mesh points in the computational domain have to be moved. Only mesh points within a certain distance from the changing geometric feature may have to be moved or adjusted. To measure such a distance, the system or the process for implementing lithographic simulation for an electronic circuit design uses the distance function from the Level Set Method in some embodiments of the invention.

Figure 9:
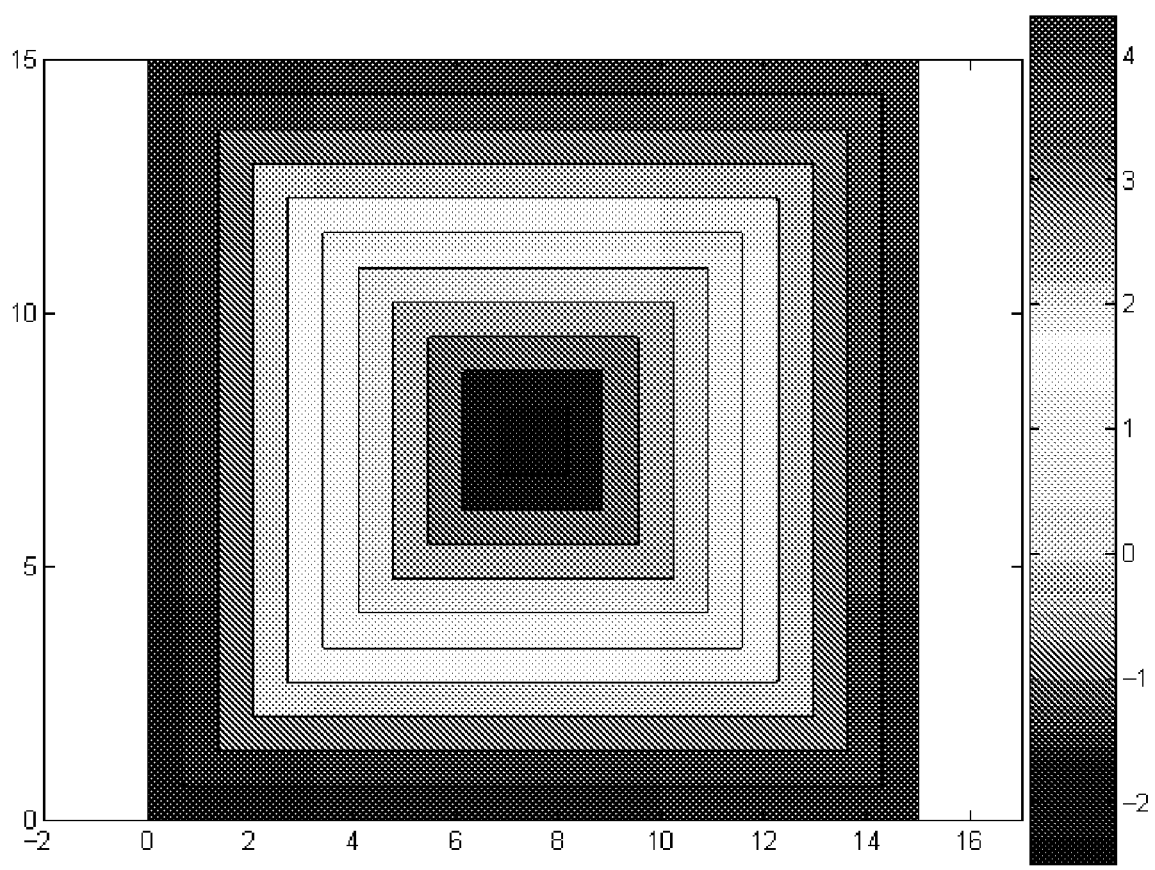
FIG. 9 illustrates the contour plot of the distance function for a square where $x_1=y_1=5$ and $x_2=y_2=10$.

The following example explains the basic ideas in the distance function. Let $(x_1, y_1)$ and $(x_2, y_2)$ be the lower-left and upper-right corner of a rectangle. The distance form a point (x,y) to such a rectangle can be defined as $$d(x,y) = -\min(\min(y-y_1, y_2-y), \min(x-x_1, x_2-x)), \quad (26)$$

Where function min(a,b) returns the smaller value of the two variables. FIG. 9 shows the contour plot of the distance function for a square where $x_1 = y_1 = 5$ and $x_2 = y_2 = 10$. It should be noted that the zero level set corresponds to the boundary of the square. All points outside of the square have positive distance and all points inside the square have negative distance. The distance function is a versatile tool in computational geometry and it has been used in a popular automatic mesh generator. In some embodiments, the system or the process for implementing lithographic simulation for an electronic circuit design uses the distance function as the distance measure and decide whether a particular mesh point is inside the influence region surrounding a changing geometry feature. The movement of a particular mesh point may depend on its distance to the changing geometry feature. The movement may become larger as the mesh point gets closer to the geometry feature. It may be vanishingly small next to the boundary of the influence region. And it may be zero if the mesh point is outside of the influence region. Some other embodiments use a simple polynomial b(η) to characterize the relationship between the distance η and the movement magnitude. Such a polynomial must satisfy the following constrains $$b(0) = 1, \quad (27)$$

$$\left.\frac{db}{d\eta}\right|_{\eta=1} = 0. \quad (28)$$

In these embodiments, the system or the process for implementing lithographic simulation for an electronic circuit design uses the normalized distance as shown in Eq. (28) below.

$$n = \frac{d(x, y)}{B}. \quad (29)$$

where B is a user-defined radius of influence. So η=1 means the mesh point is right on the boundary of influence region and η=0 means the mesh point is right on the surface of the changing geometry. In spirit, this polynomial is similar to the so-called blending function where the blending function is used to interpolate between two sets of fixed meshes to obtain a new set of meshes for the computational domain with moving boundaries. In some embodiments, the system or the process for implementing lithographic simulation for an electronic circuit design chooses the following function as the blending function $$b(x) = 2\left(1 - h\left(\frac{x}{2} + 0.5\right)\right), \quad x \in [0, 1] \quad (30)$$

where h(x) is either the third-order Hermite polynomial $$h_3(x) = 3x^2 - 2x^3 \quad (31)$$

or the fifth-order Hermite polynomial $$h_5(x) = 10x^3 - 15x^4 + 6x^5 \quad (32)$$

Figure 10:
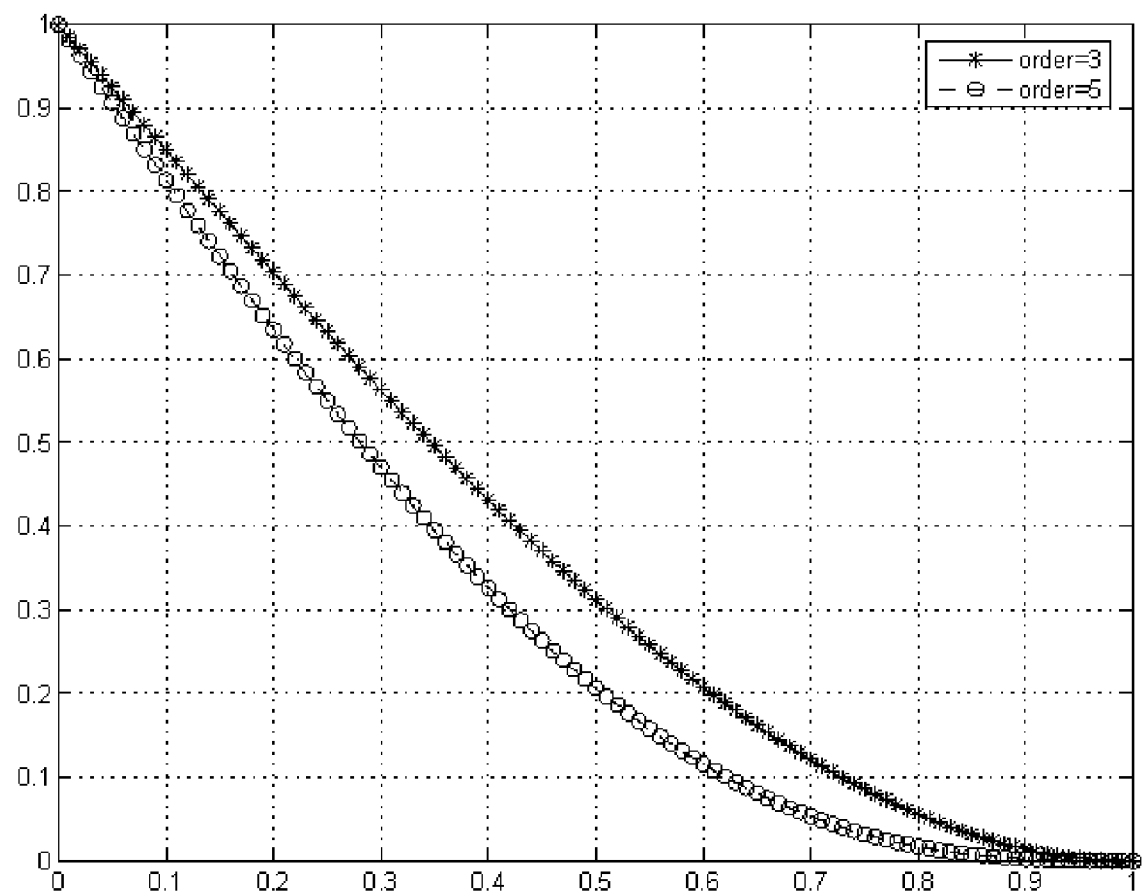
FIG. 10 illustrates the blending function for the two different Hermite polynomial orders.

FIG. 10 shows the blending function for the two different Hermite polynomial orders. In these embodiments, the third-order Hermite polynomial gives slightly better results. Armed with the blending function in Eq. (30) based on the distance function like the one defined in Eq. (26), the system or the process for implementing lithographic simulation for an electronic circuit design is ready to parameterize the movement of the mesh points due to the change of geometric features. Without loss of generality, we use the parameter $w_2$ in FIG. 3 as an example. Suppose $w_2$ is changed by $\delta w_2$. Further more, again without loss of generality, suppose that the center of the opening does not move, only the left and the right walls move by $$\frac{\delta w_2}{2},$$

respectively. In vector form, the movement for the left and the right walls can be expressed as $$\vec{m}_L = \frac{\delta w_2}{2}\vec{m}_L \quad (33)$$

$$\vec{m}_R = \frac{\delta w_2}{2}\vec{m}_R \quad (34)$$

where $$\vec{m}_L = (-1, 0) \quad (35)$$

$$\vec{m}_R = (1, 0) \quad (36)$$

Within the influence region around the left and/or right side wall, the movement of a mesh point from the initial location $\vec{r}_0 = (x_0, y_0)$ to the new location $\vec{r} = (x, y)$ can be expressed as $$\vec{r} = \vec{r}_0 + b_L \vec{m}_L + b_R \vec{m}_R = \vec{r}_0 + (b_L \vec{m}_L + b_R \vec{m}_R)\frac{\delta w_2}{2} \quad (37)$$

where $$b_L = b(d_L(x_0, y_0)) \quad (38)$$

$$b_R = b(d_R(x_0, y_0)) \quad (39)$$

and $d_L(x,y)$ and $d_R(x,y)$ are the distance to the left and the right side wall, respectively. In Eq. (37), the system or the process for implementing lithographic simulation for an electronic circuit design uses the linear superposition of the movement due to the movement of the left and the right side wall in some embodiments of the invention. Eq. (37) can be written in the more explicit scalar form as $$x = x_0 + (b_R - b_L)\frac{\delta w_2}{2} \quad (40)$$

$$y = y_0 \quad (41)$$

Figure 11:
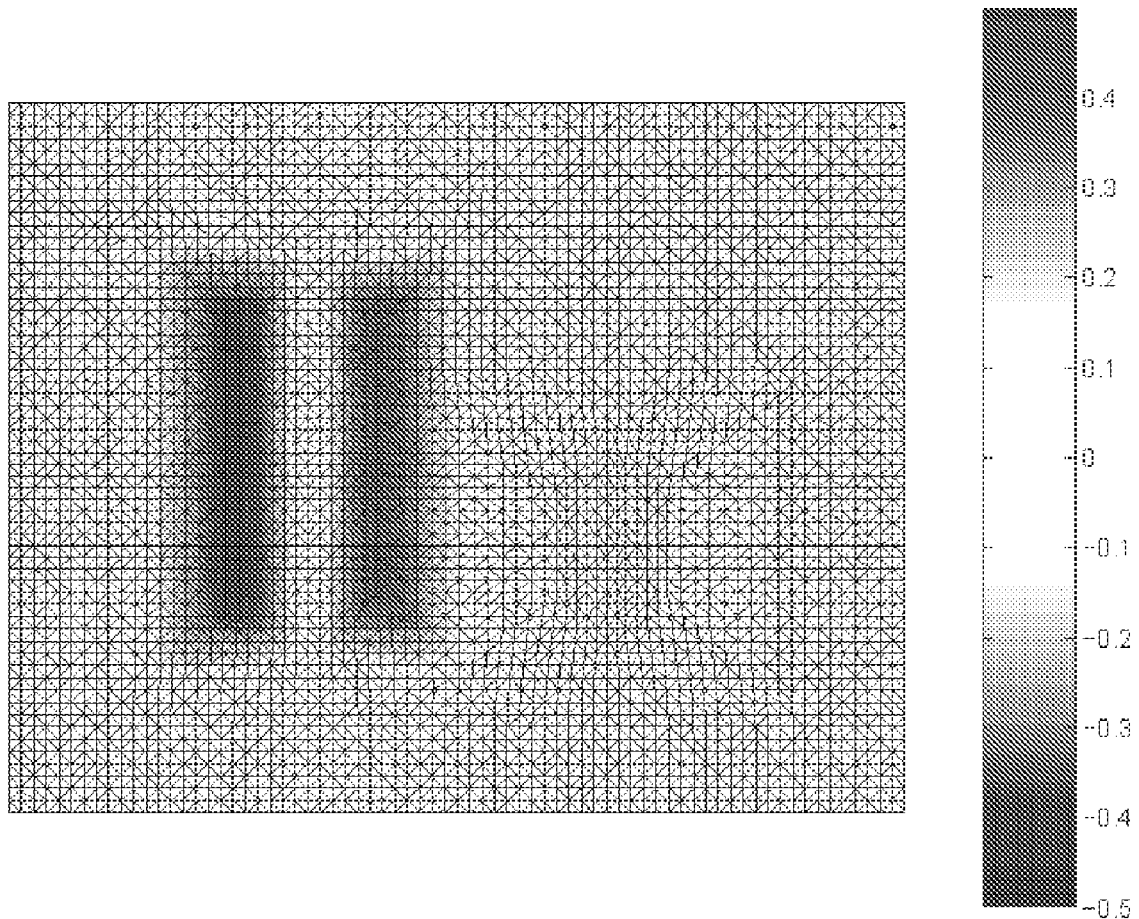
FIG. 11 illustrates the contour plot of the blending term $b_R$-$b_L$.
Figure 12:
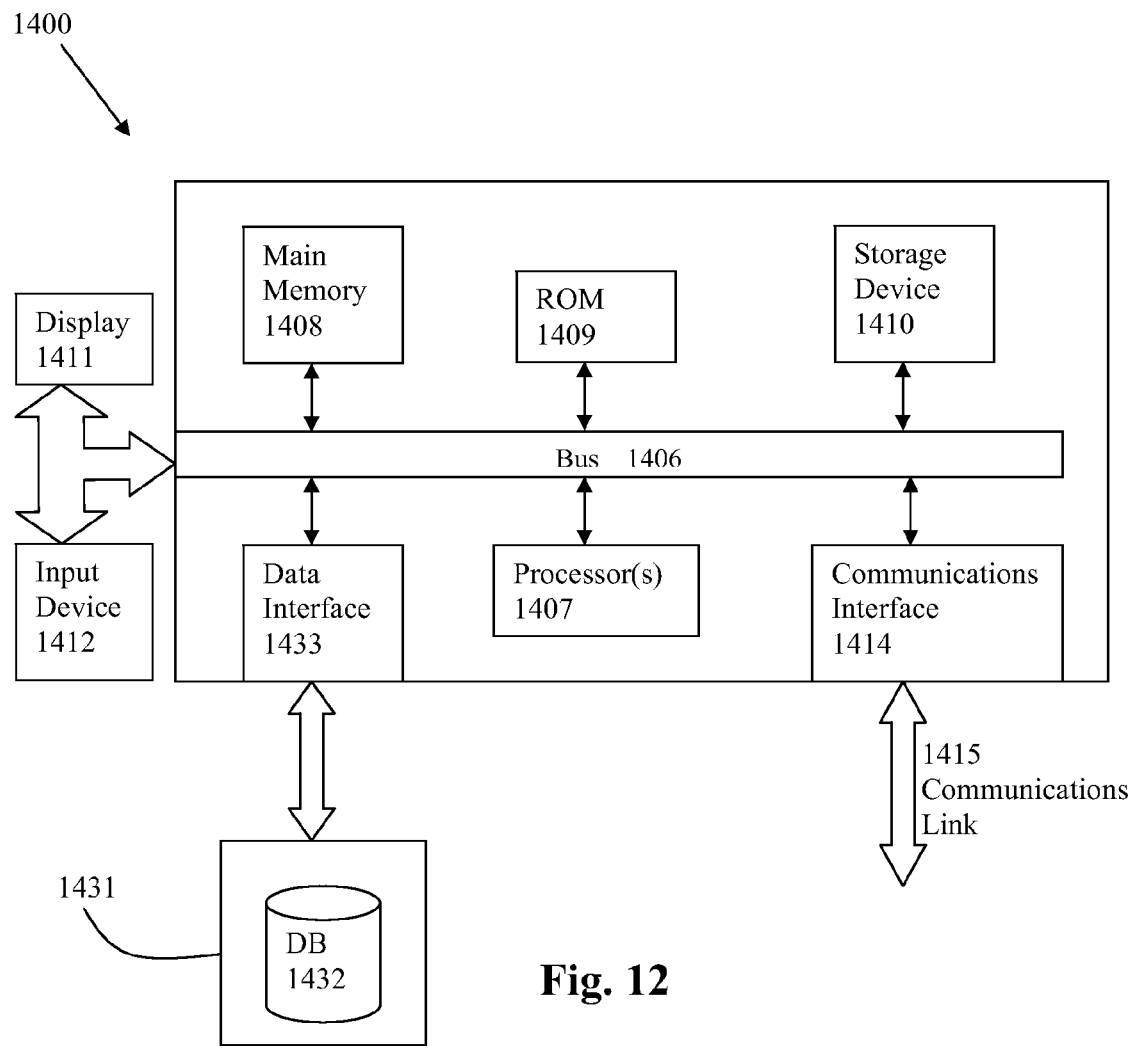
FIG. 12 depicts a computerized system on which a method for timing closure with concurrent process models can be implemented.

FIG. 11 shows the contour plot of the blending term $b_R - b_L$. Not surprisingly, this term becomes zero along the vertical line crossing the center of the opening and it is mostly negative(positive) to the left(right) of this vertical line. Using linear superposition, one can easily generalize Eq. (37) to multiple parameter cases $$\vec{r} = \vec{r}_0 + \sum b_i(\vec{r}_0)\hat{m}_i \delta w_i \quad (42)$$

where $b_i(\vec{r}_0)$ is the blending function value for the mesh points within the influence region around the i-th moving edge, $\hat{m}_i$ is the unit vector characterizing the moving direction of the i-th moving edge, and $\delta w_i$ is the movement magnitude of the i-th moving edge. In some embodiments, the parametric form in Eq. (42) is an affine function of the perturbation in each geometric parameter.

Figure 6:
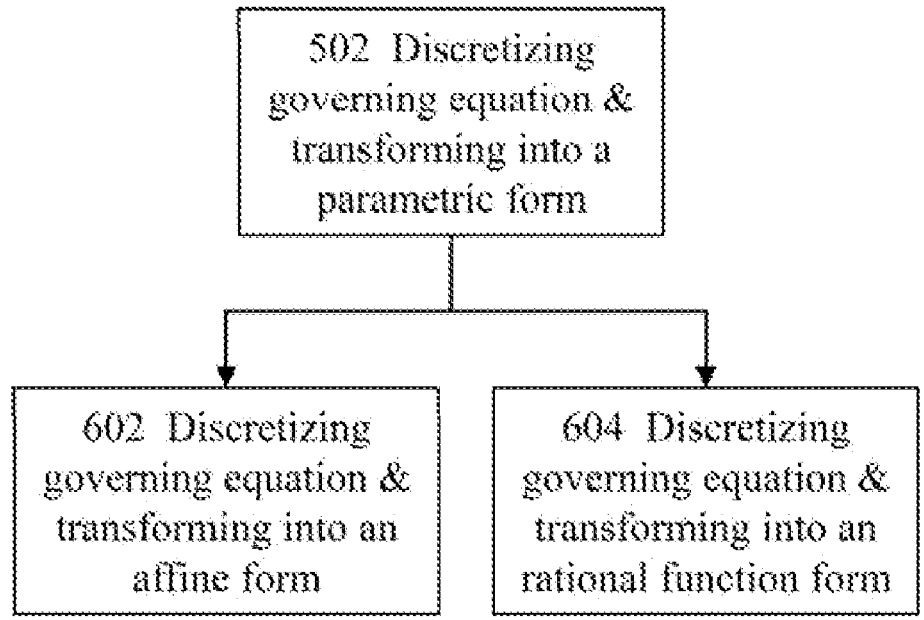
FIG. 6 illustrates some exemplary parametric forms transformed or converted by the action 502.

FIG. 6 illustrates some exemplary parametric forms transformed or converted by the action at 502. In some embodiments, the system or the process for implementing lithographic simulation for an electronic circuit design at 502 transforms or converts the one or more discretized governing equations into an affine form at 602. In some embodiments, the system or the process for implementing lithographic simulation for an electronic circuit design at 502 transforms or converts the one or more discretized governing equations into a rational function form at 604. Note that in some embodiments, the system or the process for implementing lithographic simulation for an electronic circuit design at 502 transforms or converts the one or more discretized governing equations into a rational function form or an affine form so as to obtain reduced models. Also note that the system or the process for implementing lithographic simulation for an electronic circuit design at 502 may also transform or convert the one or more discretized governing equations into other parametric forms.

In some embodiments, the system or the process for implementing lithographic simulation for an electronic circuit performs a stamping procedure to generate the stiffness matrix $S(\overline{w},\overline{s})$ and the mass matrix $M(\overline{w},\overline{s})$. In some embodiments, the 3×3 stiffness matrix $S^e(\overline{w},\overline{s})$ and the mass matrix $M^e(\overline{w},\overline{s})$ are first generated for each element. The system or the process for implementing lithographic simulation for an electronic circuit uses the local-to-global vertex index map to write the entries of $S^e$ and $M^e$ into the large matrices of $S(\overline{w},\overline{s})$ and $M(\overline{w},\overline{s})$. For the linear basis define on an isoparametric triangular element with vertices (x1,y1), (x2,y2), and (x3,y3), the stiffness matrix $S^e(\overline{w},\overline{s})$ and the mass matrix $M^e(\overline{w},\overline{s})$ may be represented as follows.

$$S^e = \frac{\vec{d}_x^T \vec{d}_x + \vec{d}_y^T \vec{d}_y}{4A}, \quad (43)$$

$$M^e = 2AM \quad (44)$$

where $$\vec{d}_x = [x_3 - x_2, x_1 - x_3, x_2 - x_1], \quad (45)$$

$$\vec{d}_y = [y_2 - y_3, y_3 - y_1, y_1 - y_2], \quad (46)$$

$$M^e = \frac{1}{24}\begin{bmatrix} 2 & 1 & 1 \\ 1 & 2 & 1 \\ 1 & 1 & 2 \end{bmatrix}, \quad (47)$$

A represents the area of the triangle and can be written as follows.

$$A = \frac{1}{2}[(x_2 - x_1)(y_3 - y_1) - (x_1 - x_3)(y_1 - y_2)], \quad (48)$$

In view of Eqs. (42), (44), (45), and (46), the mass matrix $M^e$ is a bilinear function of $\delta w_i$ in some embodiments of the invention. In some embodiments where the expansion technique such as Taylor expansion is used, the system or the process for implementing lithographic simulation for an electronic circuit design may approximate the rational function Se as follows.

$$S^e(\overline{w},\overline{s}) = \quad (49)$$
$$S^e(\overline{w}_0,\overline{s}_0) + \sum_i \delta w_i \frac{\partial S_i^e(\overline{w}_0,\overline{s}_0)}{\partial \delta w_i} + \sum_j \delta s_j \frac{\partial S_j^e(\overline{w}_0,\overline{s}_0)}{\partial \delta s_j}$$

where $(\overline{w}_0,\overline{s}_0)$ represents the nominal values. In some embodiments, the system or the process for implementing lithographic simulation for an electronic circuit design computes $$\frac{\partial S^e}{\partial x_i} \text{ and } \frac{\partial S^e}{\partial y_i}$$

from Eq. (43) by performing some simple algebraic manipulations. In some embodiments, the system or the process for implementing lithographic simulation for an electronic circuit design computes $$\frac{\partial x_i}{\partial \delta w_j} \text{ and } \frac{\partial y_i}{\partial \delta w_j}$$

from Eq. (42). Therefore, the system or the process for implementing lithographic simulation for an electronic circuit design employs the chain rule to determine $$\frac{\partial S^e}{\partial \delta w_j} \text{ and } \frac{\partial S^e}{\partial \delta w_j}.$$

In some embodiments, substituting Eq. (49) into Eq. (3) results in an equation similar to Eq. (4) such that the reduced basis method may be directly applied to obtain a reduced mask model similar to that of Eq. (7) with further mathematical manipulations.

At 504, the system or the process for implementing lithographic simulation for an electronic circuit design performs a number of stochastic sampling solves in the parameter space using a plurality of values for each of the one or more parameters in some embodiments of the invention. Such a stochastic sampling or simulation process may comprise, for example, a Monte Carlo sampling in the parameter space in some embodiments of the invention. Note that the stochastic sampling or simulation process as the Monte Carlo sampling requires a relative smaller number of samples (e.g., the parameter values) at a lower computational cost to achieve same degree of accuracy than a typical multi-dimensional curve fitting process needs. Also note that a typical multi-dimensional curve fitting process generally requires $O(Np^s)$ samples, where Np denotes the number of parameters, and s denotes the number of samples for each parameter. For example, s is set to 2 for a quadratic curve fitting along each parameter axis.

At 506, the system or the process for implementing lithographic simulation for an electronic circuit design generates or modifies a reduced parameterized model with the plurality of values for each of the one or more parameters based upon at least a criterion in some embodiments of the invention. In one embodiment, the criterion comprises determining whether a sufficient number of parameter values have been used to generate a sufficient number of results to form the reduced parameterized model which describes the lithographic model of interest with sufficient accuracy. Furthermore, in some embodiments, whether a lithographic model of interest has sufficient accuracy comprises a design choice and may be predetermined by the user or by a default convergence value. In some other embodiments, whether a lithographic model of interest has sufficient accuracy may be determined iteratively based upon some error estimation or convergence criteria. In some other embodiments, whether a lithographic model of interest has sufficient accuracy may be determined or verified with a result from a test wafer, a test chip, or the results from the wafers or chips of the production run with identical or substantially similar mask patterns. In some other embodiments, the reduced parameterized model may be calibrated with a result from a test wafer, a test chip, or a result from the wafers or chips of the production run with identical or substantially similar mask patterns.

At 508, the system or the process for implementing lithographic simulation for an electronic circuit design stores part or all of the result of the act of performing a number of stochastic sampling solves at 504. In some embodiments of the invention, the system or the process for implementing lithographic simulation for an electronic circuit design stores only the result for the near field electromagnetic field in the projection matrix. In some other embodiments of the invention, the system or the process for implementing lithographic simulation for an electronic circuit design stores the entire result of the act of performing stochastic sampling solves.

Figures 7, 8:
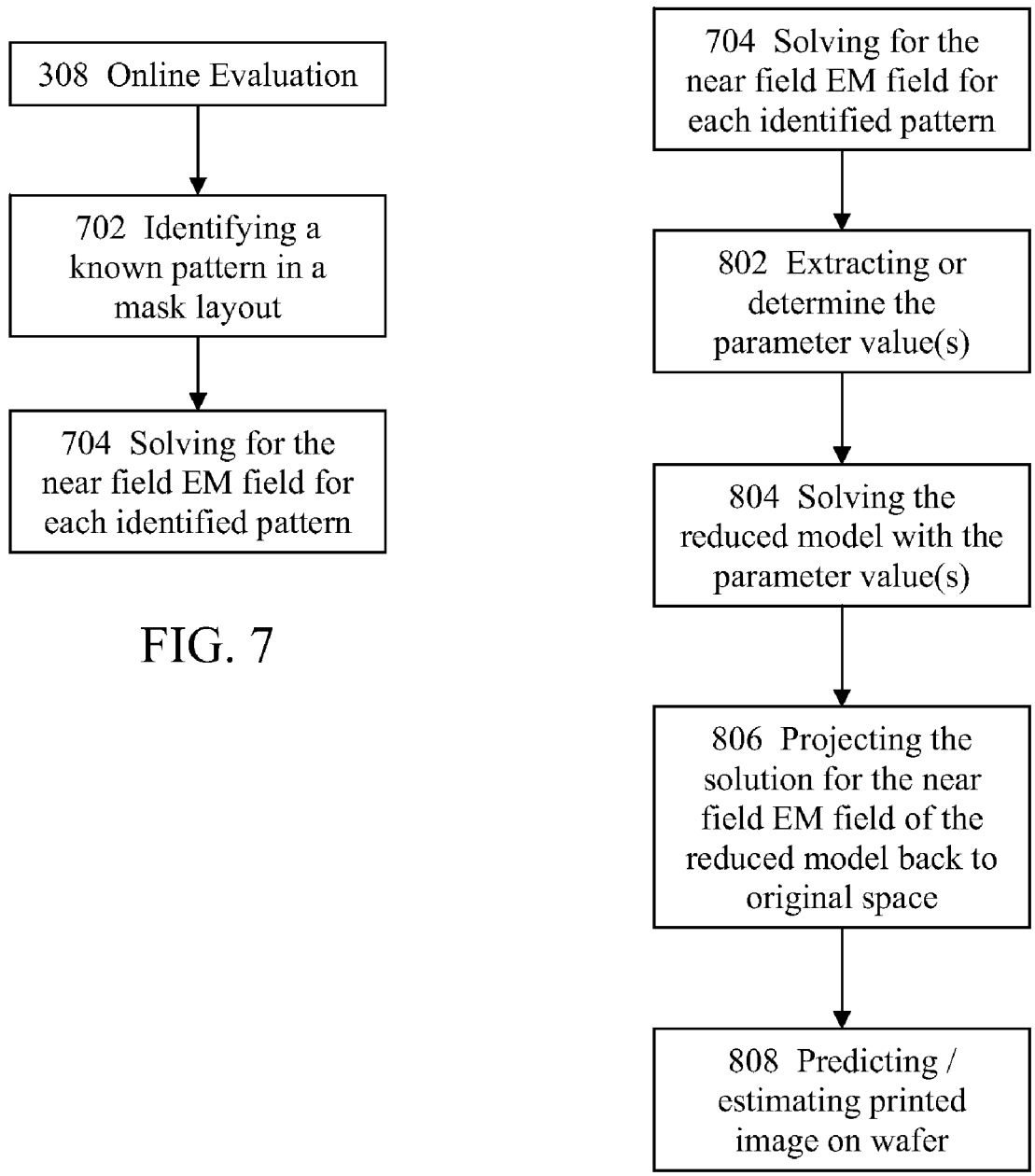
FIG. 7 illustrates more detailed information about the online evaluation module.
FIG. 8 illustrates more details about the action of solving for the near field electromagnetic field for each identified known mask pattern.

Referring to FIG. 7 which illustrates more detailed information about the online evaluation module 308. In some embodiments for the system or the process for implementing lithographic simulation for an electronic circuit design, the online evaluation module 308 identifies a known pattern in a mask layout at 702. In some embodiments of the system or the process for implementing lithographic simulation for an electronic circuit design at 704, the online evaluation module 308 solves for the near field electromagnetic (EM) field for the known pattern identified at 702. More details about the action of 704 of solving for the near field electromagnetic (EM) field for the known pattern identified are described in the following paragraphs below.

FIG. 8 illustrates more details about the action of solving for the near field electromagnetic field for each identified known mask pattern of 704. At 802, the system or the process for implementing lithographic simulation for an electronic circuit design extracts or determines the value(s) of one or more parameters of the parametric form in some embodiments of the invention. In some embodiments, the system or the process for implementing lithographic simulation for an electronic circuit design extracts the values of one or more parameters from real patterns. In some embodiments, the system or the process for implementing lithographic simulation for an electronic circuit design extracts the value(s) of the one or more parameters by using extraction techniques similar to those used in standard library-based RC extraction. In some embodiments, the system or the process for implementing lithographic simulation for an electronic circuit design may further utilizes use processes employing empirical formulae to determine the value(s) of the one or more parameters. In some embodiments, the system or the process for implementing lithographic simulation for an electronic circuit design may further employ one or more formulae based on heuristics or empirical data to determine the value(s) of the one or more parameters. In some embodiments, the system or the process for implementing lithographic simulation for an electronic circuit design may further employ model-based or physics-based approaches to simulate the value(s) of the one or more parameters. The details of these model-based or physics-based approaches to determine certain parameters of an integrated circuit are known in the art and will not be repeated here.

At 804, the system or the process for implementing lithographic simulation for an electronic circuit design solves the reduced model with the value(s) of the one or more parameters previously determined or extracted at 802 in some embodiments. In various embodiments, the system or the process for implementing lithographic simulation for an electronic circuit design solves the reduced model with the value(s) of the one or more parameters and keeps the solution for the near field electromagnetic field at 804.

At 806, the system or the process for implementing lithographic simulation for an electronic circuit design projects at least part of the solution previously obtained at 804 of the reduced model in the reduced model parameter space back to the original space in some embodiments of the invention. In some embodiments, the system or the process for implementing lithographic simulation for an electronic circuit design projects only the near field electromagnetic (EM) field solution from the reduced model parameter space at 806.

At 808, the system or the process for implementing lithographic simulation for an electronic circuit design may further predict or estimate the printed image on wafer based on a result of the action of solving the reduced model at 804 and/or the action of projecting the solution for the near field electromagnetic field at 806.

Some other embodiments further obtain the information about the fabricated or manufactured features of the design and use such information to further calibrate the models as well as the modifications to the design itself so as to improve the accuracy, effectiveness, and/or efficiency of the methods or systems described above.

Some other embodiments may use hierarchical models that compromise between computational speed and accuracy. An application of this may involve using faster but less accurate models to examine a portion of a given electronic circuit design and slower but more accurate models in the remaining regions which may become a concern.

In some embodiments, the system or the process for implementing lithographic simulation for an electronic circuit design further utilizes parallel computing or distributed computing to achieve the purpose(s).

System Architecture Overview

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410 on a data storage system 1431, or other non-volatile storage for later execution. Computer system 1400 may also interact with a database system 1432 via a data interface 1433 where the computer system 1400 may store and retrieve information or data of the electronic design into and from the database system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A machine-implemented method for lithographic simulation of an electronic circuit design, the method comprising:
   using at least a processor to perform a process, the process comprising:
   identifying a mask pattern;
   performing offline precharacterization by using at least a number of values of one or more mask parameters for obtaining a number of sampling solves for the mask pattern to generate or modify a reduced parameterized model for the mask pattern;
   performing online evaluation based at least upon a parameterized form of an equation;
   determining an electromagnetic field around the mask pattern based at least upon a result of the act of performing the online evaluation; and
   storing a result of the act of determining an electromagnetic field around the mask pattern in a tangible computer readable or usable medium.

2. The machine-implemented method of claim 1, in which the act of performing offline precharacterization comprises:
   identifying an equation which models a solution for the mask pattern and an interaction between the solution and one or more effects;
   identifying the mask pattern; and
   solving the equation for an instance of the mask pattern to generate or modify the reduced parameterized model for the mask pattern.

3. The machine-implemented method of claim 2, in which the act of solving the equation for an instance of the mask pattern to generate or modify the reduced parameterized model for the mask pattern comprises:
   transforming a discretized form of the equation into a parameterized form based at least on at least one parameter;
   performing a number of stochastic sampling solves on the parameterized form by using a number of values for the at least one parameter; and
   generating or modifying a reduced parameterized model for the mask pattern based upon a criterion.

4. The machine-implemented method of claim 3, in which the one or more effects comprise a diffraction effect, a coupling effect between an aperture of the mask pattern and another feature of the mask pattern, or a polarization effect.

5. The machine-implemented method of claim 3, in which the at least one parameter comprises a width, a height, a thickness, or a profile of a mask feature, a transmission coefficient, or one or more illumination parameters.

6. The machine-implemented method of claim 3, in which the criterion comprises determining whether the number of values for the at least one parameter is sufficient to form the reduced parameterized model.

7. The machine-implemented method of claim 3, further comprising:
   storing a result of performing the number of stochastic sampling solves in a projection matrix.

8. The machine-implemented method of claim 3, in which the parameterized form comprises an affine form or a rational function form.

9. The machine-implemented method of claim 2, in which the act of identifying the mask pattern comprises:
- identifying the mask pattern from a library of a plurality of mask patterns; and
- determining whether an adjustment is needed for the mask pattern.

10. The machine-implemented method of claim 2, in which the act of identifying the mask pattern comprises:
- identifying the mask pattern from a mask layout of the electronic circuit design.

11. The machine-implemented method of claim 1, in which the act of performing online evaluation comprises:
- identifying a known mask pattern from a mask layout of the electronic circuit design; and
- determining a near field for the known mask pattern identified by using the reduced parameterized model.

12. The machine-implemented method of claim 11, in which the act of determining the near field for the known mask pattern comprises:
- determining a plurality of parameter values for a first parameter in the known mask pattern;
- solving the reduced parameterized model with the plurality of parameter values to obtain a solution; and
- projecting a result of the act of solving the reduced parameterized model to an original space.

13. The machine-implemented method of claim 12, further comprising:
- predicting a printed image on wafer for the known mask pattern.

14. The machine-implemented method of claim 12, in which the act of determining the plurality of the parameter values comprises:
- extracting the parameter value from a layout of the electronic circuit design.

15. A system for lithographic simulation of an electronic circuit design, the system comprising:
- at least one processor that is programmed to perform the method of:
- identify a mask pattern;
- perform offline precharacterization by using at least a number of values of one or more mask parameters for obtaining a number of sampling solves for the mask pattern to generate or modify a reduced parameterized model for the mask pattern;
- perform online evaluation based at least upon a parameterized form of an equation;
- determine an electromagnetic field around the mask pattern based at least upon a result generated by the at least one processor's performing the online evaluation; and
- store a result of the act of determining an electromagnetic field around the mask pattern in a tangible computer readable or usable medium.

16. The system of claim 15, in which the the at least one processor that performs the offline precharacterization is also to:
- identify an equation which models a solution for the mask pattern and an interaction between the solution and one or more effects;
- identify the mask pattern; and
- solve the equation for an instance of the mask pattern to generate or modify the reduced parameterized model for the mask pattern.

17. The system of claim 16, in which the at least one processor that solves the equation is also to:
- transform a discretized form of the equation into a parameterized form based at least on at least one parameter;
- perform a number of stochastic sampling solves on the parameterized form by using a number of values for the at least one parameter; and
- generate or modifying a reduced parameterized model for the mask pattern based upon a criterion.

18. A computer program product comprising a non-transitory computer-usable storage medium having executable code which, when executed by at least one processor, causes the at least one processor to execute a method for lithographic simulation of an electronic circuit design, the method comprising:
- using the at least a processor to perform a process, the process comprising:
- identifying a mask pattern;
- performing offline precharacterization by using at least a number of values of one or more mask parameters for obtaining a number of sampling solves for the mask pattern to generate or modify a reduced parameterized model for the mask pattern;
- performing online evaluation based at least upon a parameterized form of an equation;
- determining a field around the mask pattern based at least upon a result of the act of performing the online evaluation; and
- storing a result of the act of determining an electromagnetic field around the mask pattern in a tangible computer readable or usable medium.

19. The computer program product of claim 18, in which the act of performing offline precharacterization of the process comprises:
- identifying an equation which models a solution for the mask pattern and an interaction between the solution and one or more effects;
- identifying the mask pattern; and
- solving the equation for an instance of the mask pattern to generate or modify the reduced parameterized model for the mask pattern.

20. The computer program product of claim 19, in which the act of solving the equation of the process comprises:
- transforming a discretized form of the equation into a parameterized form based at least on at least one parameter;
- performing a number of stochastic sampling solves on the parameterized form by using a number of values for the at least one parameter; and
- generating or modifying a reduced parameterized model for the mask pattern based upon a criterion.

* * * * *